United States Patent
Wu et al.

(10) Patent No.: US 11,196,845 B2
(45) Date of Patent: Dec. 7, 2021

(54) METHOD, APPARATUS, AND COMPUTER PROGRAM PRODUCT FOR DETERMINING DATA TRANSFER MANNER

(71) Applicant: EMC IP Holding Company LLC, Hopkinton, MA (US)

(72) Inventors: Pengfei Wu, Shanghai (CN); Kun Wang, Beijing (CN); Ming Zhang, Shanghai (CN); Jinpeng Liu, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 134 days.

(21) Appl. No.: 16/359,474

(22) Filed: Mar. 20, 2019

(65) Prior Publication Data

US 2019/0327344 A1    Oct. 24, 2019

(30) Foreign Application Priority Data

Apr. 20, 2018    (CN) .......................... 201810362306.X (51) Int. Cl.
   *H04L 29/06*      (2006.01)
   *H03M 7/30*      (2006.01)
   *H04L 12/811*      (2013.01)

(52) U.S. Cl.
   CPC .......... *H04L 69/04* (2013.01); *H03M 7/6094* (2013.01); *H04L 47/38* (2013.01)

(58) Field of Classification Search
   CPC ....... H04L 69/04; H04L 47/38; H04L 47/263; H04L 67/2828; H04L 1/0006; H03M 7/6094; H03M 7/6082; H03M 7/30
See application file for complete search history.

(56) References Cited

U.S. PATENT DOCUMENTS

| | | | | |
|---|---|---|---|---|
| 7,930,436 B1 * | 4/2011 | Znosko | ................... | H04L 69/04 709/247 |
| 8,798,383 B1 * | 8/2014 | Yadegar | ............... | H04N 19/182 382/233 |

(Continued)

FOREIGN PATENT DOCUMENTS

| | | |
|---|---|---|
| CN | 102594360 A | 7/2012 |
| CN | 107409152 A | 11/2017 |
| CN | 107526743 A | 12/2017 |

OTHER PUBLICATIONS

R. Ruolin et al., "An Adaptive Selection Algorithm of Macroblock Coding Candidate Modes," The 5th International Conference on Computer Science & Education, Aug. 24-27, 2010, pp. 1499-1502.

*Primary Examiner* — Un C Cho
*Assistant Examiner* — Yu-Wen Chang
(74) *Attorney, Agent, or Firm* — Ryan, Mason & Lewis, LLP (57) ABSTRACT

The present disclosure provides a method, apparatus and computer program product for determining a data transfer manner. The method comprises determining a first transfer completion time for transferring a data block from a first device to a second device without compression; determining a second transfer completion time for transferring the data block from the first device to the second device with the compression performed; and selecting, based on a comparison of the first and second transfer completion time, a transfer manner for the data block from a first transfer manner comprising compressing the data block and transferring the compressed data block and a second transfer manner of directly transferring the data block without compression. Through the embodiments, compressing and uncompressing are evaluated based on the transfer completion time before data transfer, so as to select a transfer (Continued)

manner suitable for data to be transferred and for devices that perform data transfer.

20 Claims, 4 Drawing Sheets

(56) References Cited

U.S. PATENT DOCUMENTS

| | | | |
|---|---|---|---|
| 2008/0098129 A1* | 4/2008 | Niddam | H04W 28/06 709/247 |
| 2013/0117298 A1 | 5/2013 | Ray | |
| 2014/0237201 A1* | 8/2014 | Swift | G06F 3/065 711/162 |
| 2015/0180936 A1* | 6/2015 | Ichien | H03M 7/30 709/217 |
| 2016/0285952 A1* | 9/2016 | Panigrahi | H04L 67/2828 |
| 2016/0344646 A1* | 11/2016 | Wang | G06N 7/005 |
| 2017/0214773 A1* | 7/2017 | Fan | H03M 7/40 |
| 2017/0347100 A1 | 11/2017 | Chou et al. | |
| 2018/0131749 A1* | 5/2018 | Dobrenko | H04L 43/0817 |
| 2019/0199832 A1* | 6/2019 | Maeda | G06F 11/1464 |

* cited by examiner

METHOD, APPARATUS, AND COMPUTER PROGRAM PRODUCT FOR DETERMINING DATA TRANSFER MANNER

RELATED APPLICATION(S)

The present application claims priority to Chinese Patent Application No. 201810362306.X, filed Apr. 20, 2018, and entitled "Method, Apparatus, and Computer Program Product for Determining Data Transfer Manner," which is incorporated by reference herein in its entirety.

FIELD

Embodiments of the present disclosure relate to the field of computer processing, and more specifically, to a method, apparatus and computer program product for determining a data transfer manner.

BACKGROUND

In a network environment, data transfer is usually required between various devices. Depending on the network transfer rate between the devices performing the data transfer, the data transfer efficiency also changes between different devices. The network transfer rate depends on the connection type between the devices. In some network environments, especially in a cloud-based network environment, the network transfer rate is associated with the locations of the devices. For example, if two devices that perform data transfer are located in a datacenter of the same cloud provider, the network transfer rate is usually high, thereby achieving rapid data transfer. If the two devices are located at different datacenters or one of the devices is located outside the datacenter, the network transfer rate is usually low or the rate of data transfer is largely dependent on the processing capability of the devices. In order to enhance data transfer rate, one choice is to perform data compression to reduce the size of data to be transferred, in addition to considering the network transfer rate. However, it usually takes time to perform the data compression. Therefore, it is expected to determine a suitable data transfer manner to improve the data transfer efficiency between the devices.

SUMMARY

Embodiments of the present disclosure provide a solution for determining a data transfer manner.

In a first aspect of the present disclosure, there is provided a method for determining a data transfer manner. The method comprises determining a first transfer completion time for transferring a data block from a first device to a second device without compression. The method also comprises determining, based on a compression time for compressing the data block, a second transfer completion time for transferring the data block from the first device to the second device with the compression performed. The method further comprises selecting, at least based on a comparison of the first transfer completion time and the second transfer completion time, a transfer manner for the data block from the following: a first transfer manner comprising compressing the data block and transferring the compressed data block, and a second transfer manner of directly transferring the data block without compression.

In a second aspect of the present disclosure, there is provided an apparatus for determining a data transfer manner. The apparatus comprises a processor and a memory coupled to the processor and having instructions stored therein which, when executed by the processor, cause the apparatus to perform acts. The acts comprise determining a first transfer completion time for transferring a data block from a first device to a second device without compression. The acts also comprise determining, based on a compression time for compressing the data block, a second transfer completion time for transferring the data block from the first device to the second device with the compression performed. The acts further comprise selecting, at least based on a comparison of the first transfer completion time and the second transfer completion time, a transfer manner for the data block from the following: a first transfer manner comprising compressing the data block and transferring the compressed data block, and a second transfer manner of directly transferring the data block without compression.

In a third aspect of the present disclosure, there is provided a computer program product. The computer program product is tangibly stored on a computer-readable medium and comprises machine-executable instructions which, when executed, cause a machine to execute the method according to the first aspect.

The Summary is to introduce a selection of concepts in a simplified form that are further described below in the Detailed Description. This Summary is not intended to identify key features or essential features of the present disclosure, nor is it intended to be used to limit the scope of the present disclosure.

BRIEF DESCRIPTION OF THE DRAWINGS

The objectives, advantages and other features of the present disclosure will become more apparent through the detailed description of example embodiments of the present disclosure with reference to the accompanying drawings, where the same reference symbols generally refer to the like elements in the example embodiments of the present disclosure.

DETAILED DESCRIPTION

Principles of the present disclosure will now be described with reference to several example embodiments illustrated in the drawings. Although some preferred embodiments of the present disclosure are shown in the drawings, it is to be appreciated that description of those embodiments is merely for the purpose of enabling those skilled in the art to better understand and further implement the present disclosure and is not intended for limiting the scope disclosed herein in any manner.

As used herein, the term "include" and its variants are to be read as open-ended terms that mean "include, but is not limited to." The term "or" is to be read as "and/or" unless explicitly being defined otherwise. The term "based on" is to be read as "based at least in part on." The terms "one example embodiment" and "an embodiment" are to be read as "at least one example embodiment." The term "another embodiment" is to be read as "at least one further embodiment." The terms "first" and "second" can represent different or the same objects. Other definitions, either explicit or implicit, may be included below.

Figure 1:
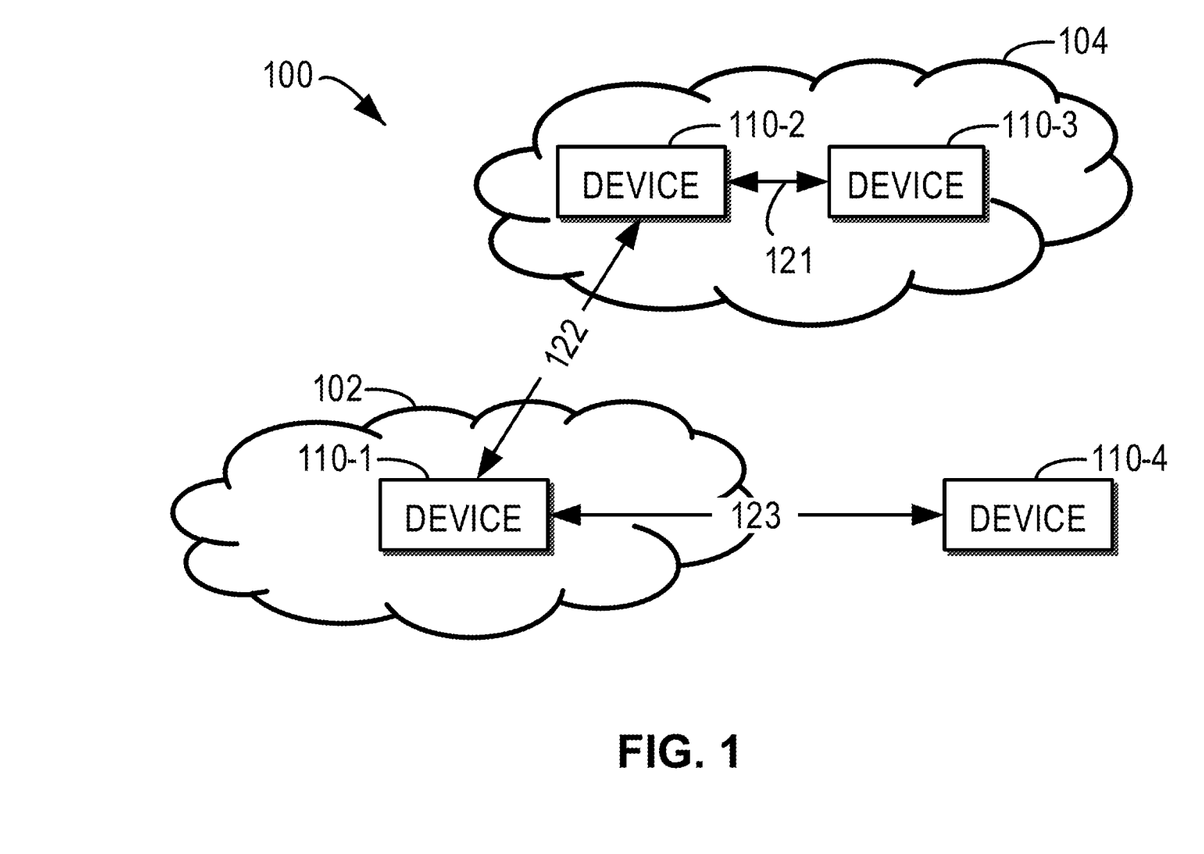
FIG. 1 illustrates a schematic diagram of an environment where embodiments of the present disclosure can be implemented.

FIG. 1 illustrates a schematic diagram of an environment 100 where embodiments of the present disclosure can be implemented. The environment 100 shown in FIG. 1 is a cloud-based network environment. According to FIG. 1, the cloud-based network environment 100 includes a plurality of cloud systems 102 and 104 each having one or more devices (also referred to as nodes) deployed therein. For example, the cloud system 102 is illustrated as being deployed with a device 110-1 and the cloud system 104 is illustrated as being deployed with devices 110-2 and 110-3.

Each cloud system 102, 104 can be provided by a corresponding cloud provider to offer a variety of services, such as data processing, data access, data storage, data backup, various software or applications, and the like. Although a limited number of devices are shown, different cloud systems may include a large number of devices, such as computing nodes and storage apparatuses in practice, and the environment 100 also may include more or a different number of cloud systems. When the deployment is performed in accordance with the cloud architecture, the cloud system does not require an end user to know the physical locations or configuration of the hardware that provides these services. In a cloud system, individual devices can communicate with each other or communicate with external devices via various types of network connections using an appropriate protocol. The network connections may be based, for example, on Wide Area Network (such as Internet), Local Area Network, Metropolitan Area Network and the like. Depending on access restrictions of the cloud, the cloud system 102 or 104 may be a public cloud accessible by the public or a private cloud belonging to a particular organization, enterprise or person. In some cases, the device cluster at a particular physical location in the cloud system may also be referred to as a datacenter. A cloud system can include a plurality of datacenters.

One or more devices 110-4 are also provided externally to the cloud systems 102 and 104, which are referred to as peripheral devices. In embodiments of the present disclosure, devices 110-1 to 110-4 can be collectively or individually referred to as devices 110 for purpose of description. In the environment 100, different devices 110 may establish network connections with each other and transfer data therebetween via the established network connections. Data transfer might occur in different cases, such as copying data from one device to a further device, recovering data across a plurality of devices, or performing data scheduling based on analysis/computation or other needs, and the like.

The two devices 110 that are to perform data transfer may be located in different cloud systems, the same cloud system, or different datacenters of the same cloud system or may even include a peripheral device external to the cloud system. As shown in FIG. 1, the devices 110-2 and 110-3 in the cloud system 104 may transfer data to one another via a network connection 121, the device 110-1 in the cloud system 102 and the device 110-2 in the cloud system 104 may transfer data to each other via a network connection 122, and the peripheral device 110-4 and the device 110-1 in the cloud system 102 may transfer data to one another via a network connection 123. During the data transfer, the data to be transferred may be stored in a storage device or a storage system associated with the cloud systems 102 and 104. The peripheral device 110-4 may be equipped with its own storage resources and processing resources.

In embodiments of the present disclosure, the device 110 can be any devices having the communication capability, such as any types of servers, controllers, computing devices, mobile devices, fixed equipment or portable devices, including a mobile phone, site, unit, device, multimedia computer, multimedia tablet, Internet nodes, communicator, desktop computer, laptop computer, notebook computer, netbook computer, tablet computer, Personal Communication System (PCS) device, personal navigation device, Personal Digital Assistant (PDA), audio/video player, digital camera/video, positioning device, television receiver, radio broadcast receiver, electronic book device, gaming device, Internet of Things (IoT) device or other devices available for communication, or any combinations thereof.

It is to be appreciated that the environment 100 shown in FIG. 1 is merely an example and does not impose any limitations on the functionality and scope of the embodiments of the present disclosure. Embodiments of the present disclosure can be applicable to any environment where data transfer is required between the devices.

In a data transfer application, data transfer efficiency between two devices is related to a network transfer rate between the two devices. In a scenario related to data transfer, the transfer rate of network connections between different devices might be different and the stability of the network connections will also vary. For example, in a single cloud system, the network transfer rate within the same datacenter is usually quite fast and stable, while the network transfer rate between different datacenters may slightly decrease but is still relatively fast and stable. In data transfer across the cloud systems, the network transfer rate across different cloud systems may also be at a higher level, but the network connections between different cloud systems may not be maintained at a stable state, which may vary the network transfer rate. The network transfer rate between a peripheral device and a device in the cloud system depends on the selected network connecting manner, so the network transfer rate may change for different peripheral devices. Further, such network connections may not be stable.

In addition to the network transfer rate, if the size of data to be transferred via the network connection is smaller, for the two devices performing the data transfer, it takes less time to complete the data transfer. Therefore, the current choice is to compress the data to be transferred at a transmitting side so as to reduce the size of data to be transferred via the network connection. The receiving device decompresses, at a receiving side, the received data to recover expected data therefrom. The data compression decreases the size of data to be transferred, which can thus improve the transfer efficiency of given data. In many current data transfer applications, the compression is selected directly to be performed on the data to be transferred. However, data compression will consume processing resources of the device at the transmitting side and also take time to complete.

In view of the above aspects, the following problems may occur in the data transfer application. If data is directly transferred between the two devices without performing any pre-processing (e.g., compression), the low or unstable network transfer rate becomes a bottleneck, lowering the data transfer efficiency. However, if all devices are forced to compress the data to be transferred, on one hand, the sizes of some types of data may not be reduced after being compressed, which makes the compression a waste of resources and time. On the other hand, different devices have different processing capabilities (e.g., having computing resources and storage resources) and workloads, so the available resources (computing and/or storage resources) of some devices can be limited and thus the data compression will block other tasks on the device or cause a longer processing delay in data compression. Moreover, in some cases, some devices can provide a higher network transfer rate but have limited processing capability. In such cases, the data compression rate provided by these devices is slower than the network transfer rate. If these devices are still forced to perform data compression, the data transfer rate will be significantly reduced.

According to embodiments of the present disclosure, there is provided a solution for determining a data transfer manner. In this solution, for a data block to be transferred from a first device to a second device, a first transfer completion time of the data block without compression and a second transfer completion time of the data block with the compression performed are determined. In the case of performing the compression, the second transfer completion time is based on a compression time of the data block. A transfer manner is selected for the data block based on a comparison of the first transfer completion time and the second transfer completion time. The selectable data transfer manners include a manner of compressing and transferring the compressed data block and a manner of directly transferring the data block without compression. By this solution, compressing and uncompressing are evaluated based on the transfer completion time before data transfer, so as to select a transfer manner suitable for data to be transferred and for devices that perform data transfer.

Embodiments of the present disclosure will be described in detail below with reference to the drawings.

Figure 2:
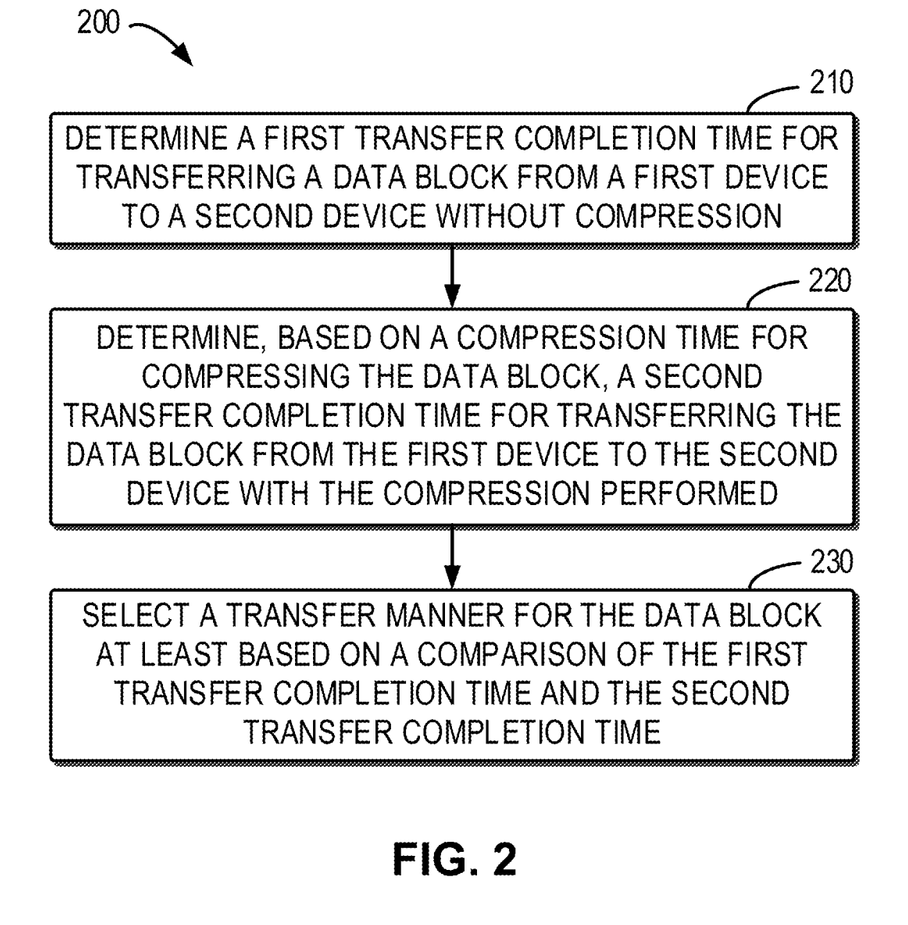
FIG. 2 illustrates a flowchart of a process of determining a data transfer manner in accordance with some embodiments of the present disclosure.

FIG. 2 illustrates a flowchart of a process 200 of determining a data transfer manner in accordance with some embodiments of the present disclosure. The process 200 can be implemented at any device 110 for transferring data in FIG. 1. In some other embodiments, the process 200 may also be implemented by other devices (such as a control device and management device) other than the device 110 having data to be transferred, which other devices perform control on the data transfer manner used by the device 110. Embodiments of the present disclosure are not limited in this regard. For purpose of discussion, the description will be provided with reference to FIG. 1. It should be appreciated that steps and the sequence of these steps shown in the process 200 are only by way of example and the process 200 may also include additional steps not shown and/or some shown steps can be omitted therefrom, and the sequence between the steps may also be changed.

At 210, the device 110 determines a first transfer completion time for transferring the data block from the device 110 to a further device 110 without compression. The device 110 is a device having data to be transferred, which is referred to as a first device 110 for purpose of discussion. The further device 110 is a device that receives the data transmitted from the first device 110, which is referred to as a second device 110 for purpose of discussion.

A data block can be a part of or all of data to be transferred from the first device 110 to the second device 110. In some embodiments, the data block can have a fixed size. For example, all of the data to be transferred can be divided into data blocks for transfer according a fixed size. The transfer manner for one, some or all of the data blocks after the division can be determined in accordance with the embodiments of the present disclosure. In some other embodiments, the size of the data block to be transferred each time can be variable, e.g., the data to be transferred is divided according to a variable size, or all of the data to be transferred each time is considered as one data block. In some embodiments, if the data to be transferred by the first device 110 is stored in a specific format in the storage system, such as the file storage system, the data can be stored in the form of specific data blocks (with a fixed or variable size). In these embodiments, such data blocks may be read directly from the storage system, and the data blocks may contain any types of information. Embodiments of the present disclosure are not limited in this regard.

When no data compression is executed, for example after reading a data block, the first device 110 may directly transfer the data block to the second device 110 without performing any preprocessing (compression). Accordingly, the time for completely transferring the data block to the second device 110 is related to the size of the data block and the network transfer rate from the first device to the second device. The network transfer rate is dependent on the network connection between the first device and the second device, e.g., dependent on the technology on which the network connection is based. The network transfer rate may vary with time. The network transfer rate for transferring the current data block may be estimated using various technologies that are currently known or to be developed in the future. By way of example only, the network transfer rate for transferring the current data block may be estimated based on an average rate of data transfer between the first device and the second device over a previous time period or an average transfer rate of one or more previous data blocks (e.g., directly determined as the previous average rate).

In some embodiments, the first device 110 determines the first transfer completion time based on the size of the data block and the network transfer rate from the first device to the second device. For example, provided that the size of the current data block is $S_c$ (in units of bytes or in other suitable units) and the network transfer rate is $v_n$ (in units of bytes per second or in other suitable units), the first transfer completion time can be determined as $$\frac{S_c}{v_n}.$$

The transfer completion time here is equal to the network transfer time for transferring the data block between the devices because the first device 110 does not perform preprocessing on the data block.

In embodiments of the present disclosure, a transfer completion time of the data block refers to the time spent by the first device 110 from obtaining the data block to transmitting all the data of the data block (e.g., from the first byte to the last byte) via the network connection. A network transfer time of the data block refers to the time spent by the first device 110 on transmitting all the data of the data block (e.g., from the first byte to the last byte) via the network connection. It is to be appreciated that depending on actual application, the first device 110 may perform operations on the data block other than compression after obtaining the data block, and the time cost of these other operations is not considered herein and may be ignored in the transfer completion time.

At 220, the first device 110 determines, based on a compression time for compressing the data block, a second transfer completion time for transferring the data from the first device 110 to the second device 110 with the compression performed. When the compression is performed, the compression time is considered in the second transfer completion time of the data block. The compression time is related to the size of the data block and the compression rate of the first device 110. The compression rate is dependent on the processing capability of the first device 110 with respect to compression. The compression rate usually is not a fixed value and may change. The compression rate of the current data block may be estimated using various technologies that are currently known or to be developed in the future. By way of example only, the compression rate of the current data block may be estimated based on an average compression rate of the first device over a previous time period or an average compression rate of the one or more previous data blocks (e.g., directly determined as the previous average compression rate). Upon determination of the compression time, it is assumed that the size of the current data block is $S_c$ (in units of bytes or in other suitable units) and the compression rate is $v_c$ (in units of bytes per second or in other suitable units), then the compression time can be determined as $$\frac{S_c}{v_c}.$$

Additionally, when a compression is to be performed, the second transfer completion time of the data block is also related to the network transfer time of the data block between the devices, i.e., related to the network transfer rate from the first device 110 to the second device 110 and the size of data to be transferred from the first device 110 to the second device 110. In the case of performing the compression, the size of data to be transferred from the first device 110 to the second device 110 is the size of the compressed data block. Therefore, in some embodiments, the first device 110 determines, based on the network transfer rate and the size of the compressed data block, the network transfer time (which is referred to as a first network transfer time for purpose of description) for transferring the compressed data block from the first device 110 to the second device 110. The size of the compressed data block is related to the compression rate, which will be discussed in detail below. If the compression is performed, the size of the compressed data block may be determined as $r*S_c$, where $S_c$ is the size of the data block (in units of bytes or in other suitable units), r is the compression rate and * means multiplication. Assuming that the network transfer rate is $v_n$ (in units of bytes per second or in other suitable units), then the first network transfer time may be determined as $$\frac{r*S_c}{v_n}.$$

In some embodiments, if the network connection between the first device 110 and the second device 110 is idle but the first device 110 still needs to wait for the completion of the data block compression before transmitting the data over the network connection, the second transfer completion time of the data block may be determined as a sum of the compression time and the first network transfer time, for example, $$\frac{S_c}{v_c} + \frac{r*S_c}{v_n}$$

The case of idle network connection usually occurs at an initial stage of data transfer, for example, when the network connection (such as the communication channel) between the first device 110 and the second device 110 is just established. Of course, the network connection between the two devices may be suddenly idle in some cases of transfer.

In some cases, although it costs time to perform the compression, it is possible that the network connection between the first device 110 and the second device 110 is transferring other data blocks instead of being idle during the compression of the current data block. At this time, the compression time of the current data block may not need to be fully considered in the second transfer completion time or may even be ignored. This is because the first device 110 cannot immediately transfer that data block even if its data compression is not performed. Accordingly, if one or more previous data blocks before the current data block are to be transferred, the first device 110 determines, based on the size of the previous data blocks and the network transfer rate, a network transfer time (which is referred to as a second network transfer time for purpose of description) for transferring the previous data blocks from the first device 110 to the second device 110. It is assumed that the size of the previous compressed data blocks is $S_p$ (in units of bytes or in other suitable units) and the network transfer rate is $v_n$ (in units of bytes per second or in other suitable units), the second network transfer time may be determined as $$\frac{S_p}{v_n}.$$

The first device 110 can configure, for example, a waiting queue in which the data blocks ready for transfer are queued. The previous data blocks can be all data blocks (which can be one or more) in the waiting queue that are located before the data block in question. In determining the size of the previous data block, if there are a plurality of previous data blocks, a sum of the sizes of these data blocks is determined. If a certain previous data block is determined to be compressed, the size of the compressed data block may be considered.

In embodiments that consider the transfer of the previous data block(s), the first device 110 can determine, based on the compression time and the second network transfer time, a waiting time of the first device 110 caused by compression of the data block if the compression is performed, and determine the second transfer completion time of the data block based on the waiting time. If the compression time does not exceed the second network transfer time, which means no extra waiting time is actually raised for the first device 110 due to the compression of the current data block, then the waiting time may be determined as zero. If the compression time exceeds the second network transfer time, which means that the first device 110 needs to wait an extra time for the completion of the compression of the current data block after transferring the previous data block, then the waiting time may be determined as the difference between the compression time and the second network transfer time. In general, if the compression time does not exceed the second network transfer time, the first device 110 determines the first network transfer time as the second transfer completion time; if the compression time exceeds the second network transfer time, the first device 110 determines a sum of the first network transfer time and the difference between the compression time and the second network transfer time as the second transfer completion time, which also may be represented as:

$$\max\left(0, \frac{S_c}{v_c} - \frac{S_p}{v_n}\right) + \frac{r*S_c}{v_n},$$

where max( ) denotes the determination of the waiting time.

Reference is still made to FIG. 2. At 230, the first device 110 selects a transfer manner for the data block at least based on a comparison of the first transfer completion time and the second transfer completion time. The first transfer completion time is an estimated time for completing data block transfer on the assumption of no compression, while the second transfer completion time is an estimated time for completing data block transfer on the assumption of performing the compression. The first device 110 can determine, based on the comparison of the two transfer times, whether the data compression will hamper the transfer of the data block over the network connection, and thus determine whether the data block is to be compressed. The manner for transferring the current data block may be further determined based on a determination of whether the data block is to be compressed. Possible transfer manners for the data block include: a first transfer manner including compressing the data block and transferring the compressed data block, and a second transfer manner of directly transferring the data block without the compression. The first device 110 can select one of the above manners to transfer the data block.

In some embodiments, if the first transfer completion time exceeds the second transfer completion time, for example, $$\frac{S_c}{v_n} > \max\left(0, \frac{S_c}{v_c} - \frac{S_p}{v_n}\right) + \frac{r*S_c}{v_n},$$

it means that the first device 110 spends a longer time on completing the transfer of the data block without compression as compared with the case of performing the compression. Therefore, the first device 110 determines that the data block can be transferred in the first transfer manner. That is, the first device 110 will first compress the data block and then transfer the compressed data block to the second device 110. In some embodiments, if the first transfer completion time does not exceed the second transfer completion time (e.g., is smaller than or equal to the second transfer completion time), it means that the first device 110 spends a longer time on completing the transfer of the data block with the compression performed as compared with the case where no compression is performed. In this case, the first device 110 determines that the data block can be transferred in the second transfer manner. That is, the first device 110 will directly transfer the data block without performing compression. In some embodiments, if the process 200 for determining the data transfer manner is performed by devices (such as a manager) other than the first device 110, the determined transfer manner can be indicated to the first device 110, such that the first device 110 can transfer the data block based on the indication.

Embodiments of determining a transfer manner for a data block have been described above with reference to FIG. 2. In some embodiments, the transfer manner of each of the plurality of data blocks to be transferred may also be determined in accordance with the process 200 of FIG. 2. In addition, for different transfer destination devices to which the block is transferred, the manner of transferring the data block to the device may also be determined based on the network transfer rate of the destination device connection. According to some embodiments of the present disclosure, whether to perform data compression or not is evaluated based on the transfer completion time before the data transfer, so as to select a data transfer manner suitable for the data to be transferred and for the devices performing the transfer. If the network transfer rate between the two devices is high and/or the compression operation of the device in charge of transmission is more time-consuming, data compression may not be performed and the data block is directly transferred. If the network transfer rate between the two devices is low and/or the compression operation of the device in charge of transmission is less time-consuming, the data compression can be performed to reduce the size of data to be transferred, so as to achieve a decrease in the overall transfer completion time. In this way, embodiments can effectively prevent the execution of compression from hampering the quick network transfer rate.

In embodiments discussed above, the transfer manner for the data block is determined by mainly considering the transfer completion time of the data block. In some embodiments, the transfer manner for the data block may also be determined by considering other additional factors. Some examples of the factors include the transfer costs, the characteristics of the data block per se, whether the second device is expected to receive compressed data, resource state of the first device and/or the second device. One or more of the factors together with the transfer completion time can determine the transfer manner for the data block, i.e., whether the compression is performed before the transfer. In some cases, if it is determined that the compression is not performed based on a certain factor, the first device 110 may decide to select the second transfer manner. If it is determined that the compression is performed based on a certain factor, the first device 110 continues to determine whether the execution of the compression is allowed by considering a further factor. If a majority of or all of the factors to be considered indicate that the compression is allowable, the first device 110 decides to select the first transfer manner. The sequence for considering different factors is not fixed or may be based on the importance of the factors.

Figure 3:
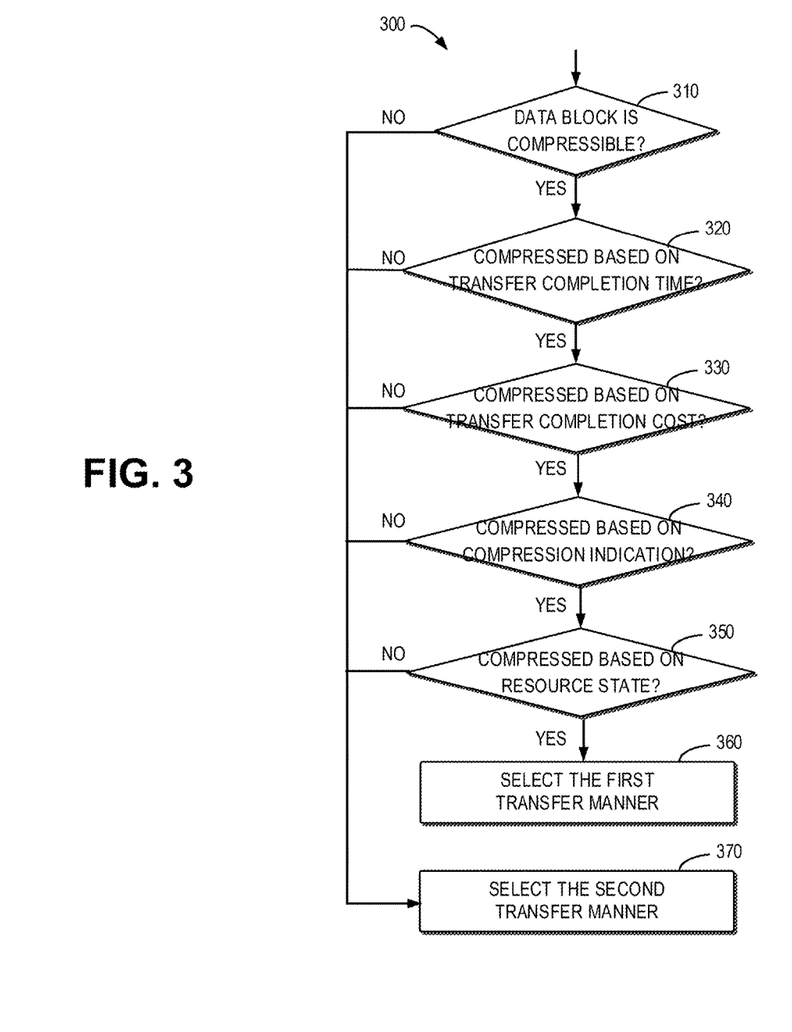
FIG. 3 illustrates a flowchart of a process of determining a data transfer manner in accordance with some other embodiments of the present disclosure.

FIG. 3 illustrates a flowchart of a process 300 of determining a data transfer manner in combination with a plurality of factors in accordance with some embodiments of the present disclosure. The process 300 can be considered as a specific implementation of the process 200, and more particularly a specific implementation of block 230 of FIG. 2. The process 300 can be implemented at any device 110 for transferring data in FIG. 1. In some other embodiments, the process 300 may also be performed at other devices (such as a control device and a management device) other than the device 110 having data to be transferred, which other devices perform control on the data transfer manner used by the device 110. Embodiments of the present disclosure are not limited in this regard. For purpose of discussion, the description will be provided with reference to FIG. 1. It should be appreciated that the steps and the sequence of these steps shown in the process 300 are only by way of example and the process 300 may also include additional steps not shown and/or some shown steps can be omitted therefrom, and the sequence between the steps may also be changed.

The first device 110 may determine the transfer manner for each data block to be transferred based on the process 300. As described above, the first device 110 may transfer one or more data blocks to the second device 110. These data blocks may be arranged in a queue. The transfer manner may be determined for each data block. If there is a data block to be transferred, the first device 110 may select a data block being currently transferred in accordance with the sequence of the data block.

At 310, the first device 110 determines whether the data block is compressible. Compressibility of the data block is determined by the characteristics of the data block per se. Although the compression operation may be performed on any data block, the size of the data block may not be further reduced as the compression is performed because some data blocks may already be in the compressed format (e.g., images in .jpeg format or audio files in .mp3 format).

The compression rate of such data blocks is low. In some embodiments, the first device 110 may determine the compression rate of the data block and determine whether the data block is compressible based on the compression rate. For example, if the compression rate is low (e.g., lower than a predetermined threshold), the first device 110 may determine the data block as incompressible. On the contrary, if the compression rate of the data block is high (e.g., exceeding a predetermined threshold), it determines that the data block is compressible. In some embodiments, it determines whether the data block is compressible based on other manners such as based on the format of the data block.

The compression rate of a given data block may be determined using various technologies that are currently known or to be developed in the future. As an example, a method for detecting the compression rate based on entropy is simply introduced. Specifically, data (such as data in binary representation) in the data block may be sampled by a given sampling rate. The sampling rate may, for example, be 50% or other values. Then, an entropy of the sampled data block (also referred to as an information entropy) is determined at the level of a certain data unit (e.g., byte). In order to determine the entropy result rapidly, it is unnecessary to calculate the actual entropy of each byte of the sampled data block. As an alternative, only the entropy of a certain number (not the entirety) of continuous bits in each byte is calculated as the approximate entropy. For example, the approximate entropy may be calculated using the last five bits of each byte only. The rapid calculation may be implemented by using the bitwise operation. Furthermore, the compression rate of the data block is evaluated based on the determined entropy of the data block.

In some embodiments, if the data block is determined as incompressible at 310, the first device 110 may determine to choose the second transfer manner for data transfer at 370, i.e., the manner of directly transferring the data block without performing the compression. There is no need to further perform the compression because the compression rate of the data block is low now. If it is determined that the data block is compressible at 310, the first device 110 may further determine whether the compression is to be performed based on other factors.

In some embodiments, the first device 110 further determines, at 320, whether the data block is to be compressed based on the transfer completion time, which may in turn determine the transfer manner for the data block. The determination based on the transfer completion time is described above with reference to the process 200 of FIG. 2. The first device 110 determines the first transfer completion time and the second transfer completion time of the data block with and without compression performed, respectively. If the first transfer completion time does not exceed the second transfer completion time, it means that the transfer of the data block will be completed faster if no compression is performed. At this time, the first device 110 may decide to not compress the data block, and instead choose the second transfer manner for transferring the data block at 370. If the first transfer completion time exceeds the second transfer completion time, it means that the transfer of the data block will be completed faster if the compression is performed. At this time, the first device 110 may continue to further determine whether the compression can be performed based on other factors.

In some embodiments, even if the comparison of the transfer completion time indicates that the compression of the data block can be performed, the first device 110 may continue to determine, at 330, whether the data block is to be compressed based on the transfer completion cost, which may further impact the determination of the transfer manner for the data block. The transfer completion cost for the data block refers to the cost spent from obtaining the data block by the first device 110 to transmission of all of the data of the data block (e.g., from the first byte to the last byte) via the network connection. In some embodiments, the transfer completion cost is related to a charge strategy for data transfer from the first device to the second device. In some data transfer scenarios, especially when data is transferred across the cloud systems provided by different cloud providers, a corresponding charge is collected for data transfer. In some embodiments, the charge strategy is also related to the size of the data to be transferred. The charge strategy may be formulated by the service provider (such as the cloud provider) and may also be associated with other factors.

In some embodiments, the first device 110 determines, based on the charge strategy and the size of the data block, the first transfer completion cost for the data block without compression, and determines, based on the charge strategy and the size of the compressed data block, the second transfer completion cost for the data block in case of performing the compression. For example, it is assumed that c( ) represents a billing formula of the charge strategy. In a simple example, the charge strategy c( ) may indicate the charge for a unit of data amount, e.g., in the unit of USD/GB or in other similar units. On this basis, the first transfer completion cost may be represented as $c(S_c)$, and the second transfer completion cost may be represented as $c(r*S_c)$, where $S_c$ represents the size of the data block and $r*S_c$ represents the size of the compressed data block as mentioned above. The transfer completion cost here involves in fact the costs brought by data transfer only, and may also be accordingly referred to as a transfer cost.

In some embodiments, the transfer completion cost is related to the transfer completion time. For some users, time is closely linked to cost. If an urgency level of transferring the data block is high, the user may be willing to pay a certain cost in exchange for completing the data transfer as fast as possible. Therefore, a time cost parameter can be configured to define the cost that the user is willing to pay for time saving. The unit of the time cost parameter can be, for example, defined as the cost per unit of time, such as USD/second or USD/hour. It can be understood that if the time cost parameter is X USD/hour, it means that the user is willing to pay X dollars for one hour. The time cost parameter can be designated by the user.

In some embodiments, the first device 110 can determine, based on the first transfer completion time and the time cost parameter, the first time cost for the data block without compression, and determine, based on the second transfer completion time and the time cost parameter, the second time cost for the data block with the compression performed. It is assumed that the time cost parameter is indicated by $\omega$ and defined as the cost per unit of time, the first time cost can be determined as $$\omega * \frac{S_c}{v_n},$$

and the second time cost can be determined as $$\omega * \left( \max\left(0, \frac{S_c}{v_c} - \frac{S_p}{v_n}\right) + \frac{r * S_c}{v_n} \right).$$

The first device 110 can further determine the first transfer completion cost based on the first time cost and the transfer cost without compression. For example, the first transfer completion cost can be determined as $$c(S_c) + \omega * \frac{S_c}{v_n}.$$

Similarly, the first device 110 may also determine the second transfer completion cost based on the second time cost and the transfer cost without compression. For example, the second transfer completion cost can be determined as $$c(r * S_c) + \omega * \left( \max\left(0, \frac{S_c}{v_c} - \frac{S_p}{v_n}\right) + \frac{r * S_c}{v_n} \right).$$

The transfer completion cost determined here considers not only the case in which the data cost between the devices is billed but also the time costs in case of data compression/non-compression and data transfer.

In some embodiments, the first device 110 determines whether the data block is to be compressed based on the comparison of the first transfer completion cost and the second transfer completion cost. The first transfer completion cost is an estimated cost for completing the data block transfer on the assumption of no compression, and the second transfer completion cost is an estimated cost for completing the data block transfer on the assumption of performing the compression. Based on the comparison of the two transfer costs, the first device 110 can determine whether a higher cost will be raised by performing the data compression during the data block transfer and determine whether the data block is to be compressed accordingly.

Specifically, if the first transfer completion cost exceeds the second transfer completion cost, for example:

$$c(S_c) + \omega * \frac{S_c}{v_n} > c(r * S_c) + \omega * \left( \max\left(0, \frac{S_c}{v_c} - \frac{S_p}{v_n}\right) + \frac{r * S_c}{v_n} \right),$$

it means that the first device 110 will spend more costs on completing the transfer of the data block without compression as compared with the case of performing the compression. Therefore, the first device 110 decides to compress the data block. If the first transfer completion cost does not exceed the second transfer completion cost (e.g., is smaller than or equal to the second transfer completion cost), it means that the first device 110 will spend more costs on completing the transfer of data block with the compression performed as compared with the case of no compression. Therefore, the first device 110 decides to not compress the data block.

In some embodiments, if it is determined that the data block is not to be compressed based on the transfer completion cost at 330, the process 300 proceeds to 370, at which the first device 110 selects the second transfer manner for the data transfer, i.e., not performing compression and directly transferring the data block. This is because the compression operation will introduce more unexpected costs for the data block. If it is determined that the data block is compressible at 330, the first device 110 can continue to further determine whether the compression is to be performed based on other factors.

In some embodiments, even if the comparison of the transfer completion cost indicates that the compression of the data block can be performed, the first device 110 may also determine, at 340, whether the data block is to be compressed based on the compression indication for the second device 110, which further can impact the determination of the transfer manner for the data block. The compression indication indicates whether the second device 110 is expected to receive the compressed data. The second device 110, after receiving the compressed data block, also needs to perform the decompression operation in order to utilize the data block, which will consume time and certain resources. If the second device 110 does not expect such decompression operation, for example, the processing resources of the second device 110 are limited or the second device 110 needs to use the data block immediately after receiving it, an indication that the second device 110 does not expect to receive the compressed data may be sent to the first device 110. This compression indication can be transmitted to the first device 110 via the network connection established between the first device 110 and the second device 110 or may be notified by other devices. In some embodiments, it is unnecessary to transmit the compression indication for each data block dynamically. Instead, the first device 110 is notified of the compression indication over a period of time, for example, in a static or semi-static way, which can save the data transfer overhead between the devices. By considering the compression indication, it can be determined whether the current data block is to be compressed based on the actual requirement of the second device 110 on data compression.

If it is determined that the second device 110 does not expect to receive the compressed data based on the compression indication, the process 300 proceeds to 370, at which the first device 110 selects the second transfer manner for the data transfer, i.e., not performing compression and directly transferring the data block. If it is determined, based on the compression indication, that the second device 110 does not reject data compression or even expects data compression, the first device 110 can continue to determine whether the compression is to be performed based on other factors.

In some embodiments, the first device 110 determines, based on the resource state, whether the data block is to be compressed at 350. The resource state, which impacts the decision of whether the data block is to be compressed, can include a first resource state of the first device 110 and/or a second resource state of the second device 110. The resource state of each device indicates the current condition of available resources at the device. The first device 110 can determine, via the available resource status, whether the first device 110 and/or the second device 110 have sufficient resources to perform the compression and/or decompression. As the processing resources (such as computing resources and storage resources) at different devices may differ, the current workloads of different devices also vary. If the resources of the device have been occupied by other tasks, it may be impossible to allocate additional resources for performing the data compression (or corresponding data decompression). Further, if the processing capability is limited (e.g., with limited resources), it is unlikely that the data block is decompressed at an appropriate speed even if the second device receives the compressed data block via a higher network transfer rate. For these situations, it is better not to perform data compression. In some embodiments, the resource state of the second device 110 can be transmitted by the second device 110 or can be notified by other devices. In some embodiments, since some types of resources in the device change dynamically, the first device 110 can be notified of the states of some relatively static types of resources only.

If it is determined that the data block is not to be compressed based on the resource state of the first device and/or the second device, the process 300 proceeds to 370, at which the first device 110 selects the second transfer manner for the data block, i.e., not performing compression and directly transferring the data block. If it is determined that the data block is to be compressed based on the resource state of the first device and/or the second device and it is unnecessary to consider the additional factors which influence the data compression, the process 300 proceeds to 360, at which the first device 110 selects the first transfer manner for the data block, i.e., compressing the data block and transferring the compressed data block.

FIG. 3 describes determining whether the data block is to be compressed based on a variety of factors and further determining the transfer manner for the data block. In the example of FIG. 3, the plurality of factors is considered sequentially, and if one of the factors indicates that the data block cannot be compressed, the second transfer manner is selected, while only when the considered factors all indicate that the data block is to be compressed, the first transfer manner is selected. However, this is only a specific example. In other variations, only one or some of the factors are considered. For example, the factors of the compression indication, resource state and the like can be omitted. In addition, the result of the determination on whether the compression is to be performed may be comprehensively achieved based on a plurality of factors. For example, if more than two factors (not all factors) indicate that the data block is to be compressed, the first transfer manner is selected. As another example, if one of the factors indicates that the data block is to be compressed, the first transfer manner can be selected regardless of the determination results based on other factors. In some embodiments, the sequence of the steps of process 300 may also be changed. For example, it can be determined whether the data block is to be compressed first based on the transfer completion cost and then based on the transfer completion time. Embodiments of the present disclosure are not limited in this regard.

According to some embodiments of the present disclosure, the data transfer can be determined by comprehensively considering factors of various aspects. Some examples of data transfer are described below in order to better understand how the determination of the data transfer manner in the present disclosure promotes data transfer efficiency between the devices.

In the environment 100 of FIG. 1, it is assumed that the edge device 110-4 with limited computing capability expects to utilize the device 110-1 with higher computing capability in the cloud system 102 to perform a data analysis task, the edge device 110-4 needs to transmit the data to the device 110-1. Since the network transfer rate from the device 110-4 to the device 110-1 is low, the large amount of data transfer will become the bottleneck of the data analysis task if the data compression is not performed. In addition, if it is directly determined that all data is to be compressed, the compression rate of the edge device 110-4 is lower than the network transfer rate due to the limited computing capability of the edge device. By means of the solution of the present disclosure, a balance between the compression rate and the network transfer rate is achieved. In addition, it can be appropriately determined whether the data should be transmitted with or without performing compression, and the data compression decision may also be performed even in the unit of a data block. Therefore, data transfer completion efficiency between the two devices can be significantly improved and the completion of the data analysis task is expedited.

In a further example, if data transfer is to be performed between the two devices (such as devices 110-2 and 110-3) within a cloud system, it can be determined that no compression is performed and the data is directly transferred by using the solution of the present disclosure since the network transfer rate between the two devices is quite high. This avoids unnecessary delay in transfer completion time and extra resource consumption brought by the compression operation.

Figure 4:
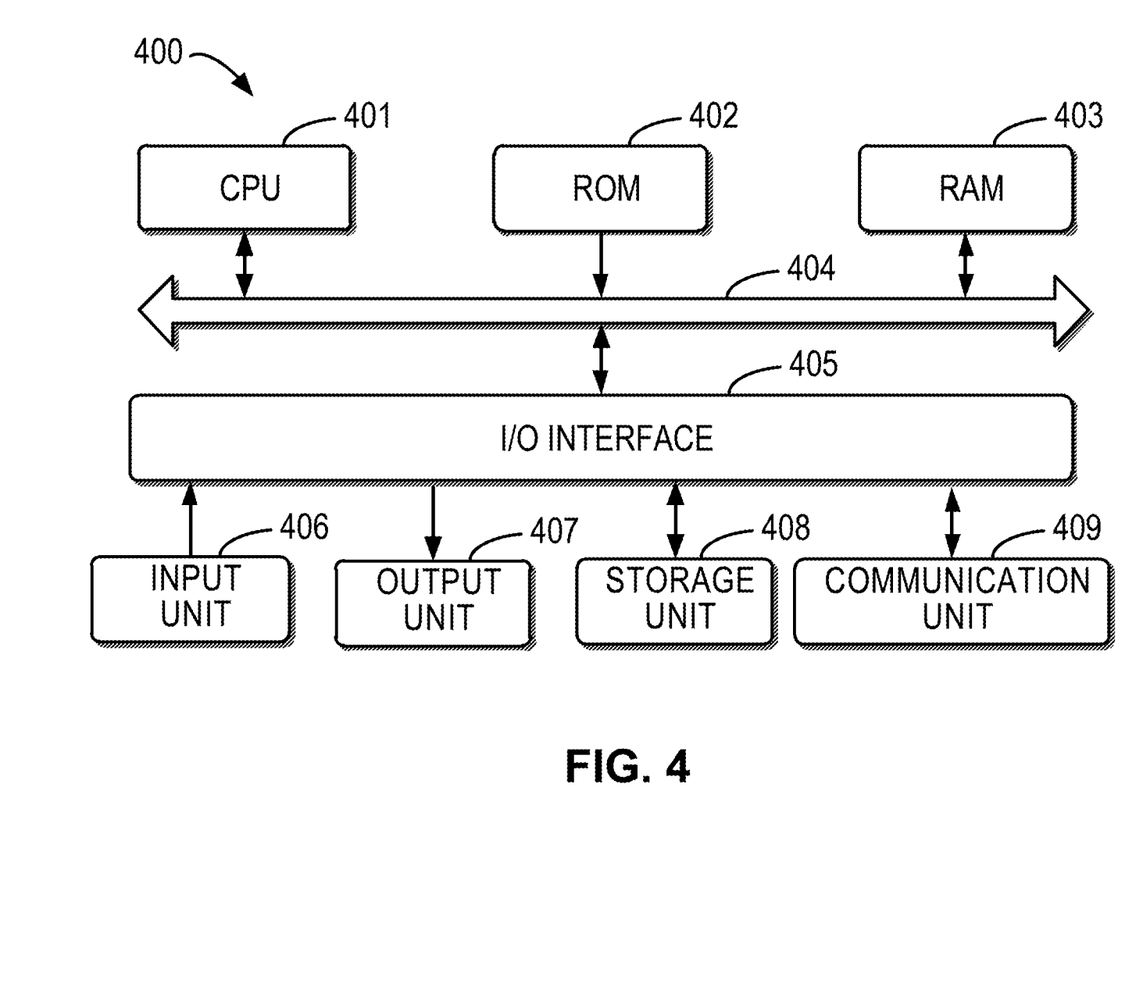
FIG. 4 illustrates a schematic block diagram of an example device for implementing embodiments of the present disclosure.

FIG. 4 illustrates a schematic block diagram of an example device 400 for implementing embodiments of the present disclosure. The device 400 can implement the process 200 of FIG. 2 and/or the process 300 of FIG. 3. The device 400 can be implemented as any device 110 of FIG. 1 or can be implemented as other devices for controlling the data transfer manner of the device 110. As shown, the device 400 includes a central process unit (CPU) 401, which can execute various suitable actions and processing based on the computer program instructions stored in the read-only memory (ROM) 402 or computer program instructions loaded in the random-access memory (RAM) 403 from a storage unit 408. The RAM 403 can also store all kinds of programs and data required by the operations of the device 400. CPU 401, ROM 402 and RAM 403 are connected to each other via a bus 404. The input/output (I/O) interface 405 is also connected to the bus 404.

A plurality of components in the device 400 is connected to the I/O interface 405, including: an input unit 406, such as keyboard, mouse and the like; an output unit 407, e.g., various kinds of displays and loudspeakers etc.; a storage unit 408, such as disk, optical disk etc.; and a communication unit 409, such as network card, modem, wireless transceiver and the like. The communication unit 409 allows the device 400 to exchange information/data with other devices via the computer network, such as Internet, and/or various telecommunication networks.

The processing unit 401 executes each method and processing described above, such as the process 200 and/or the process 300. For example, in some embodiments, the process 200 and/or the process 300 can be implemented as computer software programs or computer program products tangibly included in the machine-readable medium, such as non-transient computer-readable medium, e.g., storage unit 408. In some embodiments, the computer program can be partially or fully loaded and/or mounted to the device 400 via ROM 402 and/or communication unit 409. When the computer program is loaded to RAM 403 and executed by the CPU 401, one or more steps of the above described process 200 and/or process 300 can be executed. Alternatively, in other embodiments, the CPU 401 can be configured, via other suitable manners (e.g., by means of firmware), to execute the process 200 and/or the process 300.

Those skilled in the art should understand that each step of the above methods of the present disclosure can be implemented by a general-purpose computing apparatus. They can be integrated on a single computing apparatus or distributed on a network consisting of a plurality of computing apparatuses. Optionally, they can be implemented using the executable program codes of the computing apparatus, such that they are stored in the storage apparatus for the execution by the computing apparatus, or they are respectively manufactured into various integrated circuit assemblies, or multiple assemblies or steps in them are manufactured into a single integrated circuit assembly for implementation. Thus, the present disclosure is not restricted to any particular combinations of hardware and software.

It is to be appreciated that although the above detailed description mentions several apparatuses or sub-apparatuses of the device, the division is only exemplary rather than being compulsory. In fact, features and functions of the above described two or more apparatuses can be materialized in one apparatus according to the embodiments of the present disclosure. On the contrary, features and functions of the above described single apparatus can be further divided and materialized by several apparatuses.

The above description is only optional embodiments of the present disclosure, which does not restrict the present disclosure. For those skilled in the art, the present disclosure can have various modifications and alterations. Any amendments, equivalent substitutions, improvements and the like should be encompassed within the protection scope of the present disclosure as long as they are within the spirit and principle of the present disclosure.

What is claimed is:

1. A method for determining a data transfer manner, comprising:
   determining a first transfer completion time for transferring a data block from a first device to a second device without compression; and
   determining, based on a compression time for compressing the data block, a second transfer completion time for transferring the data block from the first device to the second device with the compression performed;
   wherein determining the second transfer completion time comprises:
   determining, based on a size of the compressed data block and a network transfer rate from the first device to the second device, a first network transfer time for transferring the compressed data block from the first device to the second device;
   determining, based on a size of a previous data block to be transferred before the data block and the network transfer rate, a second network transfer time for transferring the previous data block from the first device to the second device;
   in response to the compression time exceeding the second network transfer time, determining the second transfer completion time as a sum of (i) a difference between the compression time and the second network transfer time and (ii) the first network transfer time; and
   in response to the compression time being below the second network transfer time, determining the second transfer completion time as the first network transfer time;
   the method further comprising:
   selecting, at least based on a comparison of the first transfer completion time and the second transfer completion time, a transfer manner for the data block from the following: a first transfer manner comprising compressing the data block and transferring the compressed data block, and a second transfer manner of directly transferring the data block without compression;
   wherein selecting the transfer manner for the data block further comprises:
   obtaining a first resource state of the first device and a second resource state of the second device, the first resource state indicating a condition of available resources at the first device, and the second resource state indicating a condition of available resources at the second device; and
   selecting the transfer manner for the data block further based on the obtained first and second resource states; and
   wherein selecting the transfer manner for the data block further comprises:
   determining, based on a charge strategy for data transfer from the first device to the second device and a size of the data block, a first transfer completion cost for the data block without compression;
   determining, based on the charge strategy and a size of the compressed data block, a second transfer completion cost for the data block with the compression performed; and
   determining the transfer manner for the data block further based on a comparison of the first transfer completion cost and the second transfer completion cost.

2. The method of claim 1, wherein determining the first transfer completion time comprises:
   determining the first transfer completion time based on a size of the data block and a network transfer rate from the first device to the second device.

3. The method of claim 1, wherein selecting the transfer manner for the data block comprises:
   in response to the first transfer completion time exceeding the second transfer completion time, determining to transfer the data block in the first transfer manner; and
   in response to the first transfer completion time being below the second transfer completion time, determining to transfer the data block in the second transfer manner.

4. The method of claim 1, wherein determining the first transfer completion cost comprises:
   determining, based on the first transfer completion time and a time cost parameter, a first time cost for the data block without compression, the time cost parameter defining a cost that a user is willing to pay for time saving; and
   determining the first transfer completion cost further based on the first time cost.

5. The method of claim 1, wherein determining the second transfer completion cost comprises:
   determining, based on the second transfer completion time and a time cost parameter, a second time cost for the data block with the compression performed, the time cost parameter defining a cost that a user is willing to pay for time saving; and determining the second transfer completion cost further based on the second time cost.

6. The method of claim 1, wherein selecting the transfer manner for the data block further comprises:
determining whether the data block is compressible; and
selecting a transfer manner for the data block further based on a determination of whether the data block is compressible.

7. The method of claim 1, wherein selecting the transfer manner for the data block further comprises:
obtaining a compression indication for the second device, the compression indication indicating whether the second device is expected to receive compressed data; and
determining the transfer manner for the data block based on the compression indication.

8. An apparatus for determining a data transfer manner, comprising:
a processor; and
a memory coupled to the processor and having instructions stored therein which, when executed by the processor, cause the apparatus to perform acts comprising:
determining a first transfer completion time for transferring a data block from a first device to a second device without compression; and
determining, based on a compression time for compressing the data block, a second transfer completion time for transferring the data block from the first device to the second device with the compression performed;
wherein determining the second transfer completion time comprises:
determining, based on a size of the compressed data block and a network transfer rate from the first device to the second device, a first network transfer time for transferring the compressed data block from the first device to the second device;
determining, based on a size of a previous data block to be transferred before the data block and the network transfer rate, a second network transfer time for transferring the previous data block from the first device to the second device;
in response to the compression time exceeding the second network transfer time, determining the second transfer completion time as a sum of (i) a difference between the compression time and the second network transfer time and (ii) the first network transfer time; and
in response to the compression time being below the second network transfer time, determining the second transfer completion time as the first network transfer time;
the acts further comprising:
selecting, at least based on a comparison of the first transfer completion time and the second transfer completion time, a transfer manner for the data block from the following: a first transfer manner comprising compressing the data block and transferring the compressed data block, and a second transfer manner of directly transferring the data block without compression;
wherein selecting the transfer manner for the data block further comprises:
obtaining a first resource state of the first device and a second resource state of the second device, the first resource state indicating a condition of available resources at the first device, and the second resource state indicating a condition of available resources at the second device; and selecting the transfer manner for the data block further based on the obtained first and second resource states; and
wherein selecting the transfer manner for the data block further comprises:
determining, based on a charge strategy for data transfer from the first device to the second device and a size of the data block, a first transfer completion cost for the data block without compression;
determining, based on the charge strategy and a size of the compressed data block, a second transfer completion cost for the data block with the compression performed; and
determining the transfer manner for the data block further based on a comparison of the first transfer completion cost and the second transfer completion cost.

9. The apparatus of claim 8, wherein selecting the transfer manner for the data block comprises:
in response to the first transfer completion time exceeding the second transfer completion time, determining to transfer the data block in the first transfer manner; and
in response to the first transfer completion time being below the second transfer completion time, determining to transfer the data block in the second transfer manner.

10. The apparatus of claim 8, wherein determining the first transfer completion cost comprises:
determining, based on the first transfer completion time and a time cost parameter, a first time cost for the data block without compression, the time cost parameter defining a cost that a user is willing to pay for time saving; and
determining the first transfer completion cost further based on the first time cost.

11. The apparatus of claim 8, wherein determining the second transfer completion cost comprises:
determining, based on the second transfer completion time and a time cost parameter, a second time cost for the data block with the compression performed, the time cost parameter defining a cost that a user is willing to pay for time saving; and
determining the second transfer completion cost further based on the second time cost.

12. The apparatus of claim 8, wherein selecting the transfer manner for the data block further comprises:
determining whether the data block is compressible; and
selecting a transfer manner for the data block further based on a determination of whether the data block is compressible.

13. The apparatus of claim 8, wherein selecting the transfer manner for the data block further comprises:
obtaining a compression indication for the second device, the compression indication indicating whether the second device is expected to receive compressed data; and
determining the transfer manner for the data block based on the compression indication.

14. A computer program product being tangibly stored on a non-transitory computer-readable medium and comprising machine-executable instructions which, when executed, cause a machine to perform a method for determining a data transfer manner, the method comprising:
determining a first transfer completion time for transferring a data block from a first device to a second device without compression; and
determining, based on a compression time for compressing the data block, a second transfer completion time for transferring the data block from the first device to the second device with the compression performed;

wherein determining the second transfer completion time comprises:

determining, based on a size of the compressed data block and a network transfer rate from the first device to the second device, a first network transfer time for transferring the compressed data block from the first device to the second device;

determining, based on a size of a previous data block to be transferred before the data block and the network transfer rate, a second network transfer time for transferring the previous data block from the first device to the second device;

in response to the compression time exceeding the second network transfer time, determining the second transfer completion time as a sum of (i) a difference between the compression time and the second network transfer time and (ii) the first network transfer time; and in response to the compression time being below the second network transfer time, determining the second transfer completion time as the first network transfer time;

the method further comprising:

selecting, at least based on a comparison of the first transfer completion time and the second transfer completion time, a transfer manner for the data block from the following: a first transfer manner comprising compressing the data block and transferring the compressed data block, and a second transfer manner of directly transferring the data block without compression;

wherein selecting the transfer manner for the data block further comprises:

obtaining a first resource state of the first device and a second resource state of the second device, the first resource state indicating a condition of available resources at the first device, and the second resource state indicating a condition of available resources at the second device; and selecting the transfer manner for the data block further based on the obtained first and second resource states; and wherein selecting the transfer manner for the data block further comprises:

determining, based on a charge strategy for data transfer from the first device to the second device and a size of the data block, a first transfer completion cost for the data block without compression;

determining, based on the charge strategy and a size of the compressed data block, a second transfer completion cost for the data block with the compression performed; and determining the transfer manner for the data block further based on a comparison of the first transfer completion cost and the second transfer completion cost.

15. The computer program product of claim 14, wherein selecting the transfer manner for the data block further comprises:

determining whether the data block is compressible; and selecting a transfer manner for the data block further based on a determination of whether the data block is compressible.

16. The computer program product of claim 14, wherein selecting the transfer manner for the data block further comprises:

obtaining a compression indication for the second device, the compression indication indicating whether the second device is expected to receive compressed data; and determining the transfer manner for the data block based on the compression indication.

17. The computer program product of claim 14, wherein determining the first transfer completion time comprises:

determining the first transfer completion time based on a size of the data block and a network transfer rate from the first device to the second device.

18. The computer program product of claim 14, wherein selecting the transfer manner for the data block comprises:

in response to the first transfer completion time exceeding the second transfer completion time, determining to transfer the data block in the first transfer manner; and in response to the first transfer completion time being below the second transfer completion time, determining to transfer the data block in the second transfer manner.

19. The computer program product of claim 14, wherein determining the first transfer completion cost comprises:

determining, based on the first transfer completion time and a time cost parameter, a first time cost for the data block without compression, the time cost parameter defining a cost that a user is willing to pay for time saving; and determining the first transfer completion cost further based on the first time cost.

20. The computer program product of claim 14, wherein determining the second transfer completion cost comprises:

determining, based on the second transfer completion time and a time cost parameter, a second time cost for the data block with the compression performed, the time cost parameter defining a cost that a user is willing to pay for time saving; and determining the second transfer completion cost further based on the second time cost.

* * * * *